United States Patent
Tanaka

(10) Patent No.: US 11,190,161 B2
(45) Date of Patent: Nov. 30, 2021

(54) FILTER DEVICE

(71) Applicant: Murata Manufacturing Co., Ltd., Nagaokakyo (JP)

(72) Inventor: Akira Tanaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/928,023

(22) Filed: Jul. 14, 2020

(65) Prior Publication Data

US 2021/0036676 A1 Feb. 4, 2021

(30) Foreign Application Priority Data

Jul. 31, 2019 (JP) .............................. JP2019-140585

(51) Int. Cl.
| | | |
|---|---|---|
| *H03H 7/46* | (2006.01) | |
| *H03H 7/01* | (2006.01) | |
| *H03H 7/12* | (2006.01) | |

(52) U.S. Cl.
CPC ............. *H03H 7/12* (2013.01); *H03H 7/461* (2013.01)

(58) Field of Classification Search
CPC .......... H03H 7/01; H03H 7/0115; H03H 7/46; H03H 7/461; H03H 7/463
See application file for complete search history.

(56) References Cited

U.S. PATENT DOCUMENTS

| | | | |
|---|---|---|---|
| 9,444,424 B2* | 9/2016 | Mizoguchi | ............. H03H 7/463 |
| 10,236,856 B2* | 3/2019 | Kaminishi | ............. H03H 7/463 |
| 10,432,237 B2* | 10/2019 | Takeuchi | ............ H01L 23/5329 |
| 2017/0222616 A1 | 8/2017 | Kitami et al. | |

FOREIGN PATENT DOCUMENTS

| | | |
|---|---|---|
| JP | 2016-039334 A | 3/2016 |
| JP | 2017-135636 A | 8/2017 |

* cited by examiner

*Primary Examiner* — Dean O Takaoka

(74) *Attorney, Agent, or Firm* — Keating & Bennett, LLP

(57) ABSTRACT

A diplexer includes a common terminal, first and second terminals, and first and second filters which are electrically connected to the common terminal. The first filter passes a high frequency signal in a first frequency band. The second filter passes a high frequency signal in a second frequency band higher than the first frequency band. Each filter includes an inductor and a capacitor in a dielectric substrate. The first filter includes a first inductor with one end electrically connected to the common terminal, and a first capacitor electrically connected between another end of the first inductor and a ground. An inductance of the first inductor is smaller than an inductance of another inductor included in the first filter. A frequency of an attenuation pole defined by the first inductor and the first capacitor is higher than a frequency of the second frequency band.

16 Claims, 8 Drawing Sheets

FILTER DEVICE

CROSS REFERENCE TO RELATED APPLICATIONS

This application claims the benefit of priority to Japanese Patent Application No. 2019-140585 filed on Jul. 31, 2019. The entire contents of this application are hereby incorporated herein by reference.

BACKGROUND OF THE INVENTION

1. Field of the Invention

The present invention relates to filter devices, and more specifically, to features that significantly improve attenuation characteristics in a diplexer with two laminated LC filters.

2. Description of the Related Art

Japanese Unexamined Patent Application Publication Nos. 2016-039334 and 2017-135636 disclose diplexers including two LC filters having different frequency bands, and each including an inductor and a capacitor formed in a multilayer substrate. In such diplexers, each filter selectively demultiplexes a signal in a pass band of the filter from a high frequency signal received at a common terminal, and outputs the resultant signal to a circuit in a subsequent stage.

In general, it is important for a diplexer to secure an amount of attenuation outside a pass band of each filter in order to reduce noise and loss of signals passing through the filter.

In recent years, in communication standards of Wi-Fi and the fifth generation mobile communication system (5G), and the like, frequency bands used for communication have been shifted to higher frequency bands, and along with this, it is necessary to improve attenuation characteristics in higher frequency bands even with existing devices used in a frequency band at about 2 GHz.

In the above-described LC filters including the inductor and the capacitor, the attenuation characteristics of each filter may be adjusted by the number and/or frequency of attenuation poles formed by inductors and capacitors. In a case of a diplexer, in order to improve attenuation characteristics in a frequency band higher than a pass band of a high frequency side filter, a method of adding an attenuation pole by adding an element, for example, an inductor to the high frequency side filter is usually used. However, adding the new element to the high frequency side filter may increase loss of the high frequency side filter itself.

SUMMARY OF THE INVENTION

Preferred embodiments of the present invention significantly improve attenuation characteristics of an attenuation band on a high frequency side while significantly reducing or preventing an increase in loss of each filter in diplexers.

A filter device according to a preferred embodiment of the present invention is provided in a dielectric substrate having a multilayer structure. The filter device includes a common terminal, a first terminal and a second terminal, and a first filter and a second filter. The first filter is provided between the common terminal and the first terminal, and passes a high frequency signal in a first frequency band. The second filter is provided between the common terminal and the second terminal, and passes a high frequency signal in a second frequency band higher than the first frequency band. Each of the first filter and the second filter includes at least one inductor and at least one capacitor which are provided in a dielectric substrate. The first filter includes a first inductor with one end electrically connected to the common terminal, and a first capacitor electrically connected between another end of the first inductor and a ground potential. An inductance of the first inductor is smaller than an inductance of another inductor included in the first filter. A frequency of an attenuation pole defined by the first inductor and the first capacitor is higher than a frequency of the second frequency band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
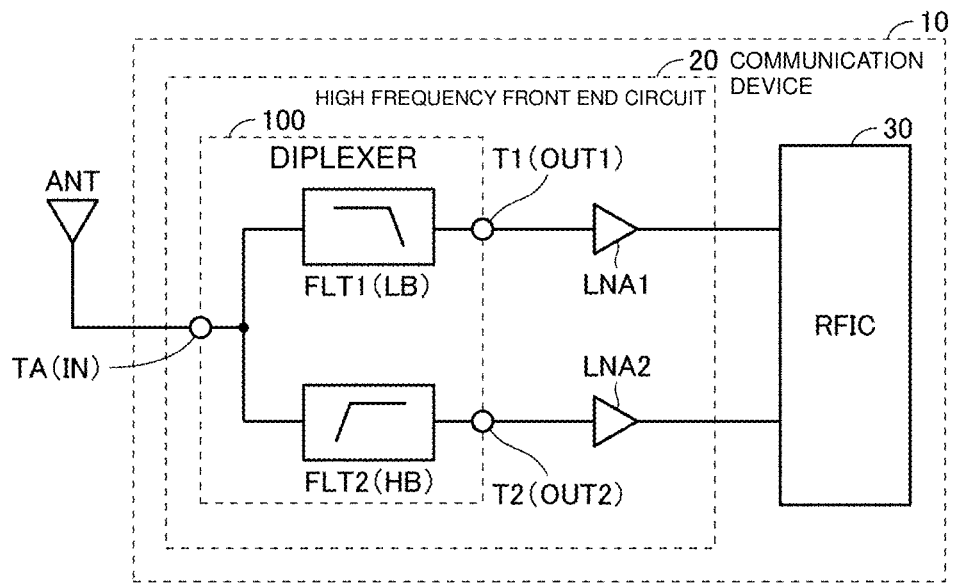
FIG. 1 is a block diagram of a communication device to which a diplexer according to a preferred embodiment of the present invention is applied.

Hereinafter, preferred embodiments of the present invention will be described in detail with reference to the accompanying drawings. Note that the same or corresponding portions in the drawings are denoted by the same reference numerals, and the description thereof will not be repeated.

Configuration of Communication Device

FIG. 1 is a block diagram of a communication device 10 including a high frequency front end circuit 20 to which a filter device 100 according to a preferred embodiment of the present invention is applied. The high frequency front end circuit 20 demultiplexes a high frequency signal received by an antenna device ANT into signals in a plurality of predetermined frequency bands, and transmits the demultiplexed signals to a subsequent processing circuit. The high frequency front end circuit 20 may be used, for example, in a mobile terminal such as a mobile phone, a smartphone, a tablet, or the like or in a communication device such as a personal computer with a communication function.

Referring to FIG. 1, the communication device 10 includes the high frequency front end circuit 20 including the filter device 100, and an RF signal processing circuit (hereinafter, also referred to as an "RFIC") 30. The high frequency front end circuit 20 shown in FIG. 1 is a reception system front end circuit. The high frequency front end circuit 20 includes the filter device 100, and amplifier circuits LNA1 and LNA2.

The filter device 100 is a diplexer that includes a filter FLT1 (first filter) and a filter FLT2 (second filter) whose pass bands are different from each other in frequency range. In the following description, the filter device 100 may be referred to as the "diplexer 100" in some cases.

The filter FLT1 is electrically connected between an antenna terminal TA, which is a common terminal, and a first terminal T1. The filter FLT1 is a low pass filter in which a frequency range of a low band (LB) group is a pass band and a frequency range of a high band (HB) group is an attenuation band. The filter FLT2 is electrically connected between the antenna terminal TA and a second terminal T2. The filter FLT2 is a high pass filter in which the frequency range of the high band group is a pass band and the frequency range of the low band group is an attenuation band. Note that the filter FLT1 and the filter FLT2 may be band pass filters, for example. The pass band of the filter FLT1 corresponds to the "first frequency band," and the pass band of the filter FLT2 corresponds to the "second frequency band."

Each of the filters FLT1 and FLT2 passes only high frequency signals corresponding to the pass band of each filter among high frequency signals received by the antenna device ANT. Accordingly, the received signals from the antenna device ANT are demultiplexed into signals in a plurality of predetermined frequency bands.

Each of the amplifier circuits LNA1 and LNA2 is a low noise amplifier. Each of the amplifier circuits LNA1 and LNA2 amplifies a high frequency signal that has passed through the corresponding filter with low noise, and communicates the amplified high frequency signal to the RFIC 30.

The RFIC 30 is an RF signal processing circuit that processes high frequency signals transmitted and received by the antenna device ANT. Specifically, the RFIC 30 performs signal processing on a high frequency signal input from the antenna device ANT via a reception side signal path of the high frequency front end circuit 20 by down conversion or the like, and outputs a received signal generated by the signal processing to a base band signal processing circuit (not shown).

When the high frequency front end circuit 20 is used as a reception circuit as shown in FIG. 1, in the diplexer 100, the antenna terminal TA defines and functions as an input terminal IN, and the first terminal and the second terminal define and as a first output terminal OUT1 and a second output terminal OUT2, respectively. However, the high frequency front end circuit is also able to be used as a transmission circuit, with each of the first terminal and the second terminal of the diplexer 100 defining and functioning as an input terminal and the antenna terminal TA defining and functioning as a common output terminal. Accordingly, a power amplifier may be provided as an amplifier included in the amplifier circuit.

Configuration of Diplexer

Figure 2:
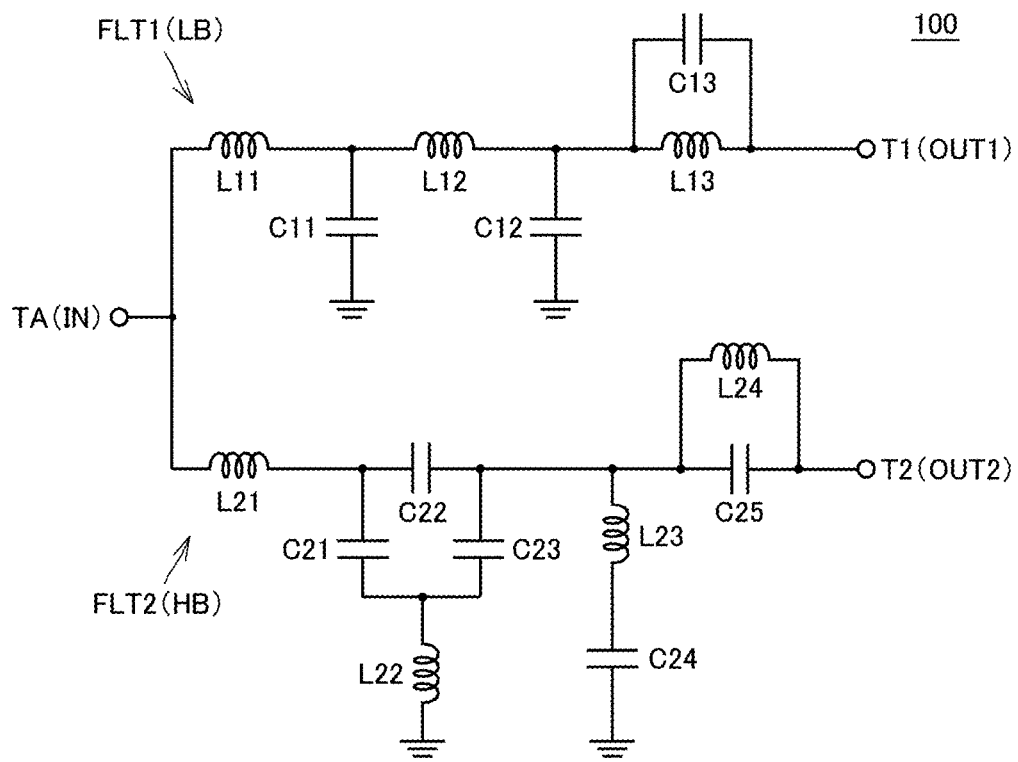
FIG. 2 is a diagram showing an equivalent circuit of an example of the diplexer in FIG. 1.

FIG. 2 is a diagram showing an equivalent circuit of an example of the diplexer in FIG. 1. As described with reference to FIG. 1, the filter FLT1 is electrically connected between the antenna terminal TA and the first terminal T1. Also, the filter FLT2 is electrically connected between the antenna terminal TA and the second terminal T2.

The filter FLT1 includes inductors L11, L12, and L13 and a capacitor C13 that define a series arm circuit, and capacitors C11 and C12 that define a parallel arm circuit. The inductors L11, L12, and L13 are electrically connected in series between the antenna terminal TA and the first terminal T1. The capacitor C13 is electrically connected in parallel to the inductor L13. The capacitor C11 is electrically connected between a connection node of the inductor L11 and the inductor L12 and a ground potential. The capacitor C12 is electrically connected between a connection node of the inductor L12 and the inductor L13 and the ground potential.

The filter FLT2 includes inductors L21 and L24 and capacitors C22 and C25 that define a series arm circuit, and inductors L22 and L23, and capacitors C21, C23, and C24 that define a parallel arm circuit. The inductor L21 and the capacitors C22 and C25 are electrically connected in series between the antenna terminal TA and the second terminal T2. The inductor L24 is electrically connected in parallel to the capacitor C25.

The capacitor C21 and the inductor L22 are electrically connected in series between a connection node of the inductor L21 and the capacitor C22 and the ground potential. The capacitor C23 is electrically connected between a connection node of the capacitor C22 and the capacitor C25 of the series arm circuit and a connection node of the capacitor C21 and the inductor L22. The inductor L23 and the capacitor C24 are electrically connected in series between another connection node of the capacitor C22 and the capacitor C25 and the ground potential.

In the diplexer described above, attenuation poles are defined by the inductors and the capacitors that are correspondingly electrically connected to the inductors in each filter. Attenuation characteristics of each filter are set by adjusting a frequency of the attenuation pole determined by an inductance of each inductor and capacitance of the corresponding capacitor.

In the diplexer 100 of the present preferred embodiment, in the filter FLT1 on the low band side, an inductance of the inductor L11 closest to the common antenna terminal TA is set to be smaller than inductances of the other inductors L12 and L13 of the filter FLT1. Then, a frequency of an attenuation pole defined by the inductor L11 and the capacitor C11 is set to be higher than a frequency of the pass band of the filter FLT2 on a high band side. Further, an inductance of the inductor L12 following the inductor L11 of the filter FLT1 is set to be larger than inductances of the other inductors L11 and L13 of the filter FLT1.

Next, internal components and elements of the diplexer 100 will be described with reference to FIGS. 3 to 5. The diplexer 100 includes a rectangular parallelepiped or a substantially rectangular parallelepiped dielectric substrate 110 provided by laminating a plurality of dielectric layers in a laminating direction. Inside the dielectric substrate 110, the inductors and the capacitors shown in FIG. 2 are defined by a plurality of wiring patterns provided in each dielectric layer and a plurality of vias provided between the dielectric layers. In the following description, the laminating direction of the dielectric substrate 110 is referred to as a "Z-axis direction", a direction perpendicular or substantially perpendicular to the Z-axis direction and along a long side of the dielectric substrate 110 is referred to as an "X-axis direction", and a direction along a short side of the dielectric substrate 110 is referred to as a "Y-axis direction". In the following, a positive direction of the Z-axis in each drawing may be referred to as an upper side, and a negative direction may be referred to as a lower side in some cases.

Figure 3:
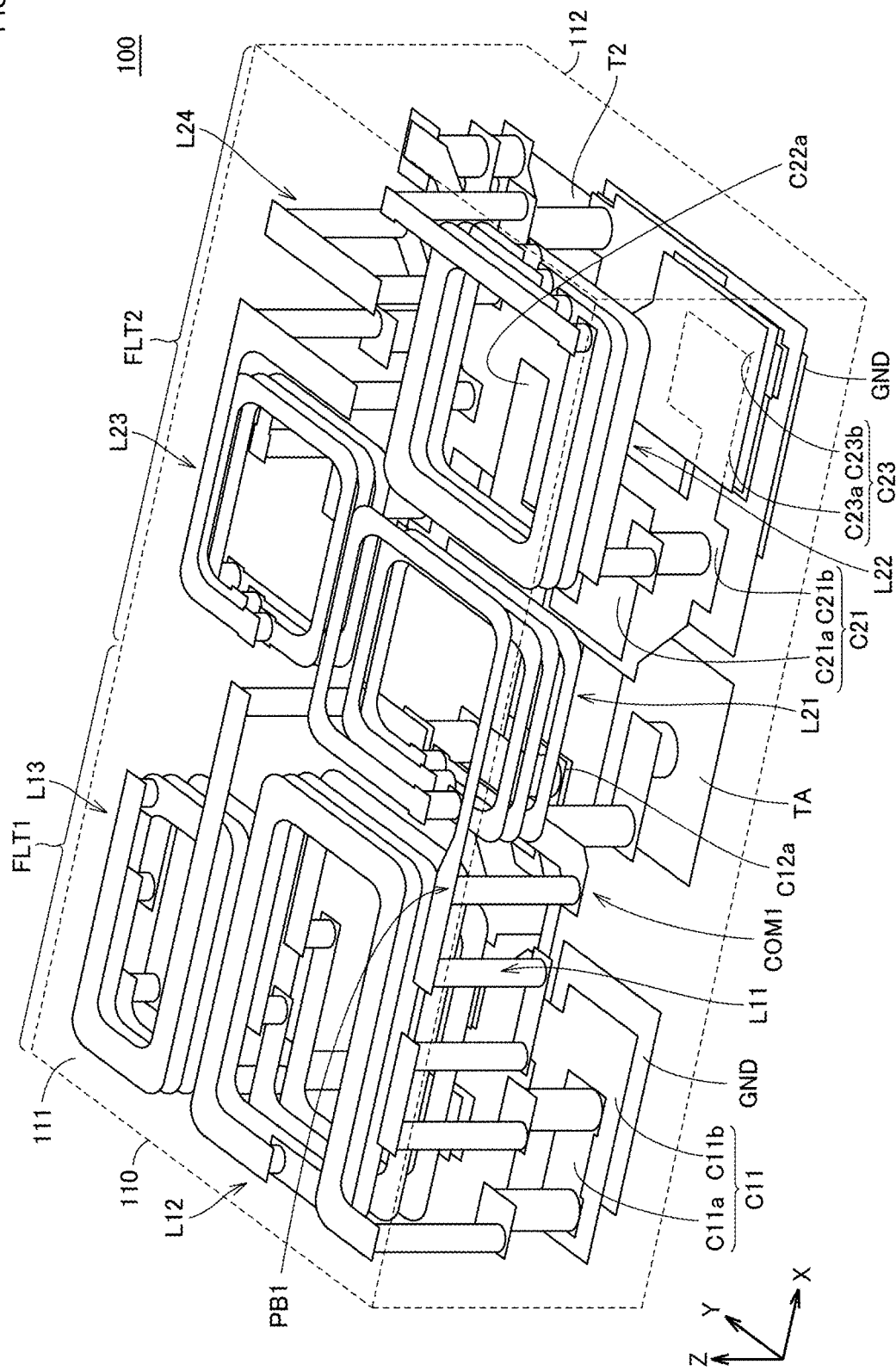
FIG. 3 is a first perspective view of an external configuration of the diplexer.
Figure 4:
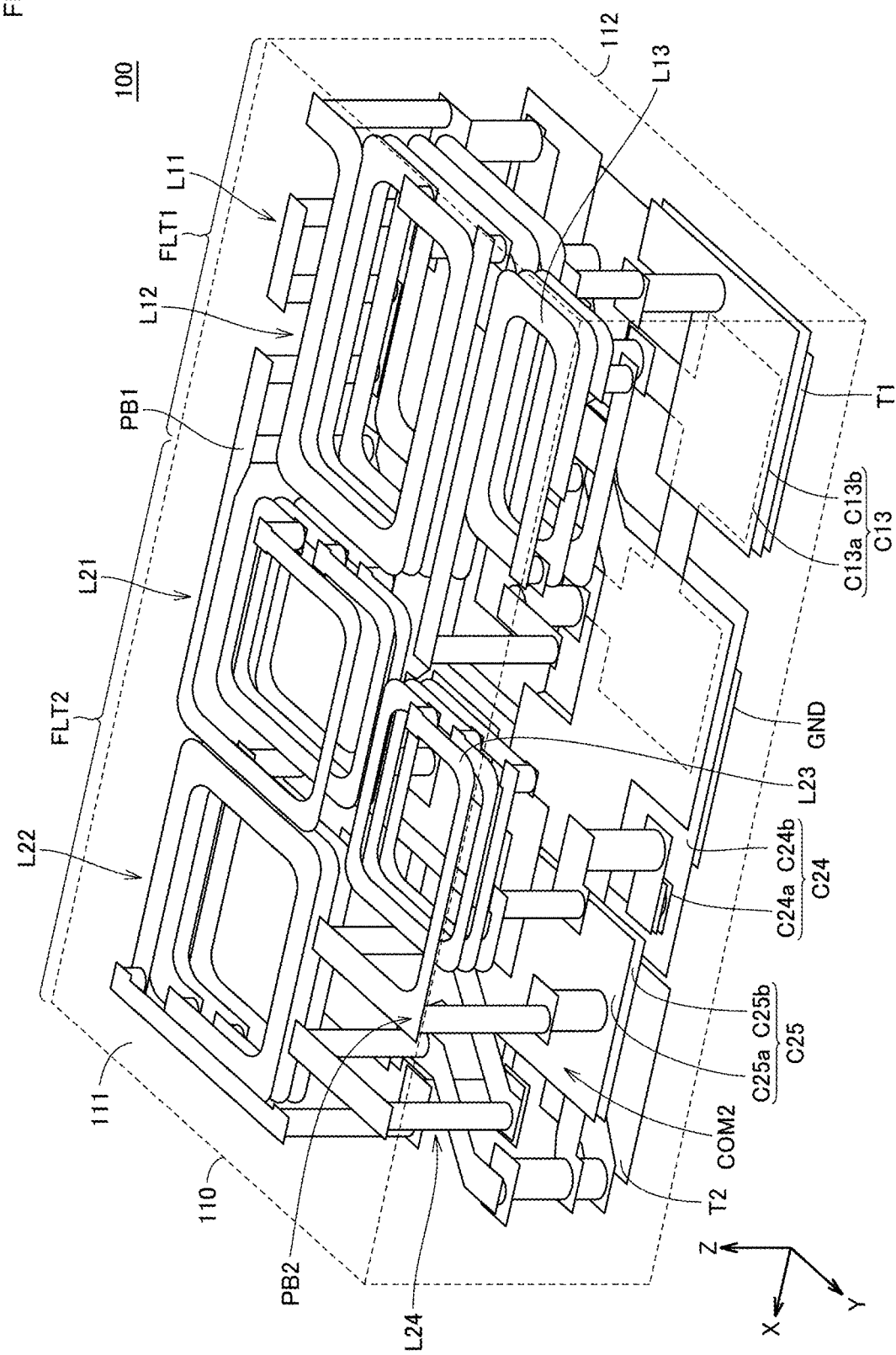
FIG. 4 is a second perspective view of an internal configuration of the diplexer.

FIG. 3 is a perspective view of the diplexer 100 seen through from a negative direction of the Y-axis, and FIG. 4 is a perspective view of the diplexer 100 seen through from a positive direction of the Y-axis. Further, FIG. 5 is a plan view of the diplexer 100 seen through from the positive direction of the Z-axis. FIGS. 3 to 5, a dielectric of the dielectric substrate 110 is omitted, and only conductors, for example, wiring patterns, vias, and terminals that are provided inside the dielectric substrate are shown. Further, in the plan view in FIG. 5, only the inductors in the filters FLT1 and FLT2 are shown.

Referring to FIGS. 3 and 4, the dielectric substrate 110 includes an upper surface 111 and a lower surface 112. External terminals (antenna terminal TA, first terminal T1, second terminal T2, and ground terminal GND) that electrically connect the diplexer 100 and external devices are plate-shaped electrodes, and are land grid array (LGA) terminals regularly located on the lower surface 112 of the dielectric substrate 110. In the example shown in FIG. 3, the filter FLT1 on the low band side is provided on a left side portion of the dielectric substrate 110, and the filter FLT2 on the high band side is provided on a right side portion.

A common line COM1 including vias and wiring patterns is provided from the antenna terminal TA located on the lower surface 112 to a branch point PB1 on an upper surface 111 side. The inductor L11 of the filter FLT1 and the inductor L21 of the filter FLT2 are electrically connected to the branch point PB1.

The inductor L11 includes vias and wiring patterns, and is provided as a meandering coil extending in the negative direction of the X-axis from the branch point PB1 when the dielectric substrate 110 is viewed in plan from the positive direction of the Z-axis. The meandering coil is, for example, a coil defined by a plurality of vias and a plurality of wiring patterns or a coil that provides a current direction with respect to the Z-axis direction that is inverted once or more when a current flowing from one end to another end of the coil is assumed. The inductor L11 is electrically connected to the inductor L12 via an electrode C11a. The electrode C11a faces an electrode C11b electrically connected to the ground terminal GND to define the capacitor C11. The inductor L12 is provided as a helical coil having a winding axis extending in the Z direction. The inductor L12 is electrically connected to the inductor L13 and an electrode C13a via an electrode C12a that defines the capacitor C12. The capacitor C13 is defined by the electrode C13a and an electrode C13b. The inductor L13 is provided as a helical coil having a winding axis extending in the Z direction. The inductor L13 is electrically connected to the electrode C13b, and is also electrically connected to the first terminal T1 located below the inductor L13.

The inductor L21 of the filter FLT2 electrically connected to the branch point PB1 is provided as a helical coil having a winding axis extending in the Z direction. The inductor L21 is electrically connected to one end of the inductor L22 via an electrode C21a and an electrode C21b that define the capacitor C21. The inductor L22 is provided as a helical coil having a winding axis extending in the Z direction. Another end of the inductor L22 is electrically connected to the ground terminal GND.

Further, an electrode C23a electrically connected to the electrode C21b at the one end of the inductor L22 faces an electrode C23b to define the capacitor C23. The electrode C23b is electrically connected to an electrode C25a in FIG. 4, and the electrode C25a faces an electrode C25b electrically connected to the second terminal T2 to define the capacitor C25. An electrode C22a electrically connected to the electrode C21a faces an electrode C22b to define the capacitor C22.

A common line COM2 including vias and wiring patterns is provided from the electrode C25a to a branch point PB2 on the upper surface 111 side. The inductor L23 and the inductor L24 of the filter FLT2 are electrically connected to the branch point PB2.

The inductor L23 is provided as a helical coil having a winding axis extending in the Z direction. The inductor L23 is electrically connected to an electrode C24a. The electrode C24a faces an electrode C24b electrically connected to the ground terminal GND to define the capacitor C24. The inductor L24 includes vias and wiring patterns, and is provided as a helical coil having a winding axis extending in the Z direction. The inductor L24 is electrically connected to the second terminal T2.

Figure 5:
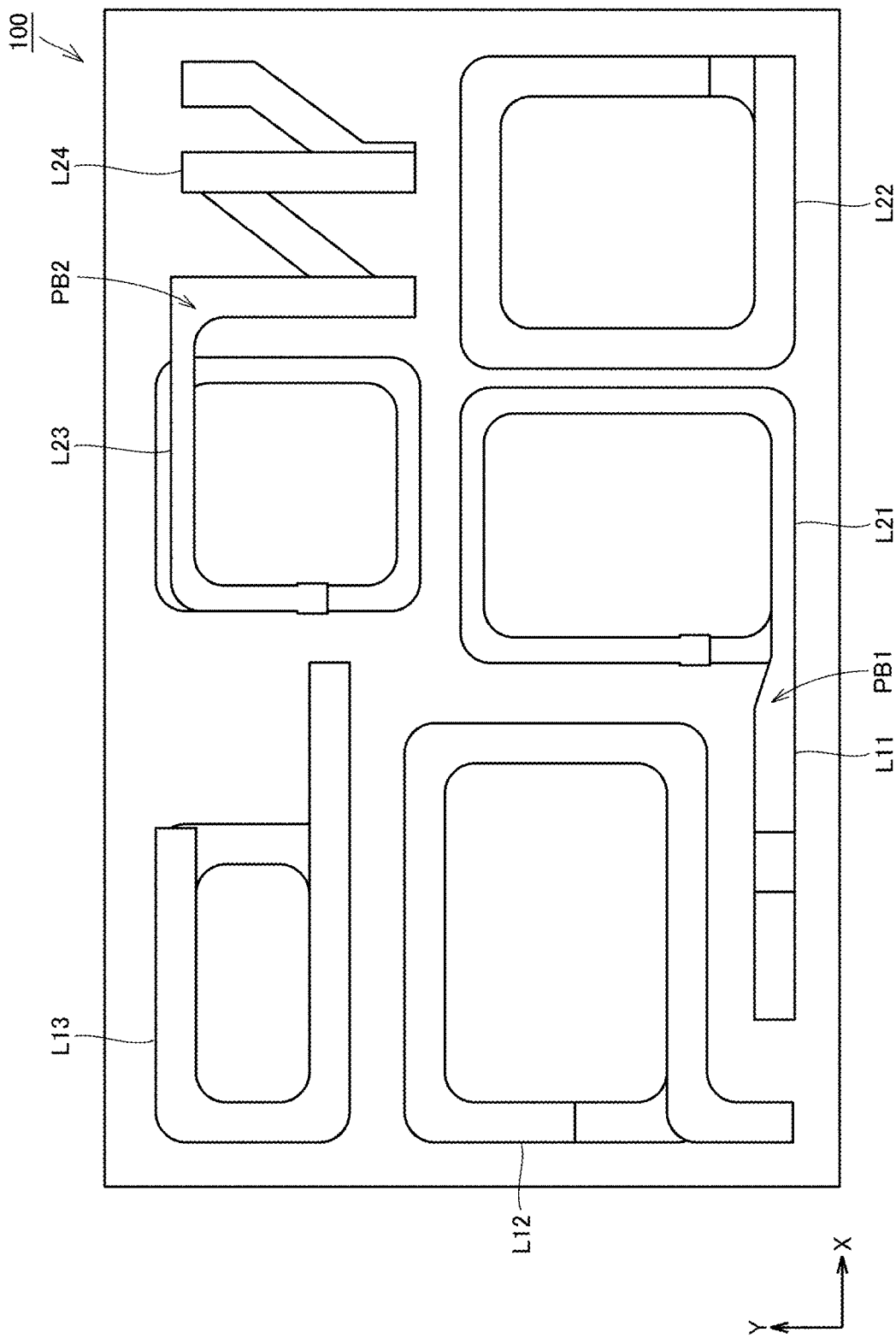
FIG. 5 is a plan view of the internal configuration of the diplexer.

As shown in FIG. 5, when the dielectric substrate 110 is viewed in plan from the positive direction of the Z-axis, the inductors L11 to L13 and L21 to L24 of the filters FLT1 and FLT2, respectively, are located to not overlap each other.

In recent years, to increase speed and improve quality in wireless communication, communication frequencies have been promoted to set to higher frequencies. For example, this corresponds to a 5 GHz band in Wi-Fi communication, or a millimeter wave band, for example, a 28 GHz, 39 GHz, 60 GHz band, or the like, in the 5G communication standard.

With the use of higher frequency bands, attenuation characteristics must be improved in these higher frequency bands even in diplexers for 2 GHz band devices that have been used in the art.

Attenuation characteristics have been improved by including a filter on a high band side of the diplexer as a band pass filter and adjusting the number and/or frequency of attenuation poles on a high frequency side of a pass band. However, when an electronic component, for example, an inductor to set a new attenuation pole, is added to a high band side circuit, the loss due to a change in the stray capacitance between elements or the conductor loss of the additional element may increase the overall loss of the filter on the high band side.

In the diplexer 100 according to the present preferred embodiment, in the filter FLT1 on the low band side, the inductance of the inductor L11 located closest to the common terminal (antenna terminal TA) is set to be smaller than the inductances of the other inductors L12 and L13, and the frequency of the attenuation pole defined by the inductor L11 is set to be higher than the frequency of the pass band of the filter FLT2 on the high band side. Accordingly, the attenuation pole is able to be added in the frequency band higher than the pass band of the filter FLT2 without adding a new electronic component to the high band side circuit. Therefore, attenuation characteristics of the attenuation band on the high frequency side are able to be significantly improved while significantly reducing or preventing an increase in the loss of the filter on the high band side.

Regarding the filter FLT1 on the low band side, since the inductance of the added inductor L11 is set to be smaller than those of the other inductors of the filter FLT1, the loss during operation of the filter FLT1 is able be maintained at a low value.

As described with reference to FIGS. 3 to 5, the inductor L11 of the filter FLT1 on the low band side is provided as the meandering coil. Unlike a helical coil, in the meandering coil, since the coils provided in respective dielectric layers do not overlap with each other, the loss due to the stray capacitance of the coil itself is relatively small. That is, by providing the inductor L11 as the meandering coil, the loss caused by the inductor L11 is able to be significantly reduced.

Further, as shown in FIG. 5, the inductor L11 is located at a position where the inductor L11 does not overlap with the other inductors in the diplexer 100 when the dielectric substrate 110 is viewed in plan from the Z-axis direction. Accordingly, the increase in the stray capacitance of the inductor L11 is able to be significantly reduced or prevented, and the loss caused by the inductor L11 is able to be further reduced.

Note that the attenuation pole added to the high band side is provided by a low pass filter defined by the inductor L11 and the capacitor C11. Therefore, by setting a capacitance value of the capacitor C11 to be smaller than capacitance values of the other capacitors of the filter FLT1, the loss of the low pass filter defined by the inductor L11 and the capacitor C11 is able to be further significantly reduced.

Further, as described above, in the filter FLT1 on the low band side, the second inductor L12 adjacent to the inductor L11 preferably has a larger inductance than the other inductors of the filter FLT1, for example. When the inductance of the inductor L12 is increased, the impedance of the inductor L12 when viewed from the filter FLT2 on the high band side is increased, and the inductor L12 is able to be brought close to an open state. Accordingly, leaking of a high frequency signal on the high band side to the low band side is able to be significantly reduced or prevented, and the effect of the attenuation pole defined by the inductor L11 and the capacitor C11 is able to be significantly enhanced.

Comparison of Bandpass Characteristics

Next, the advantageous effects of the components and elements of the diplexer 100 of the preferred embodiment will be described by comparing with a diplexer of a comparative example.

Figure 6:
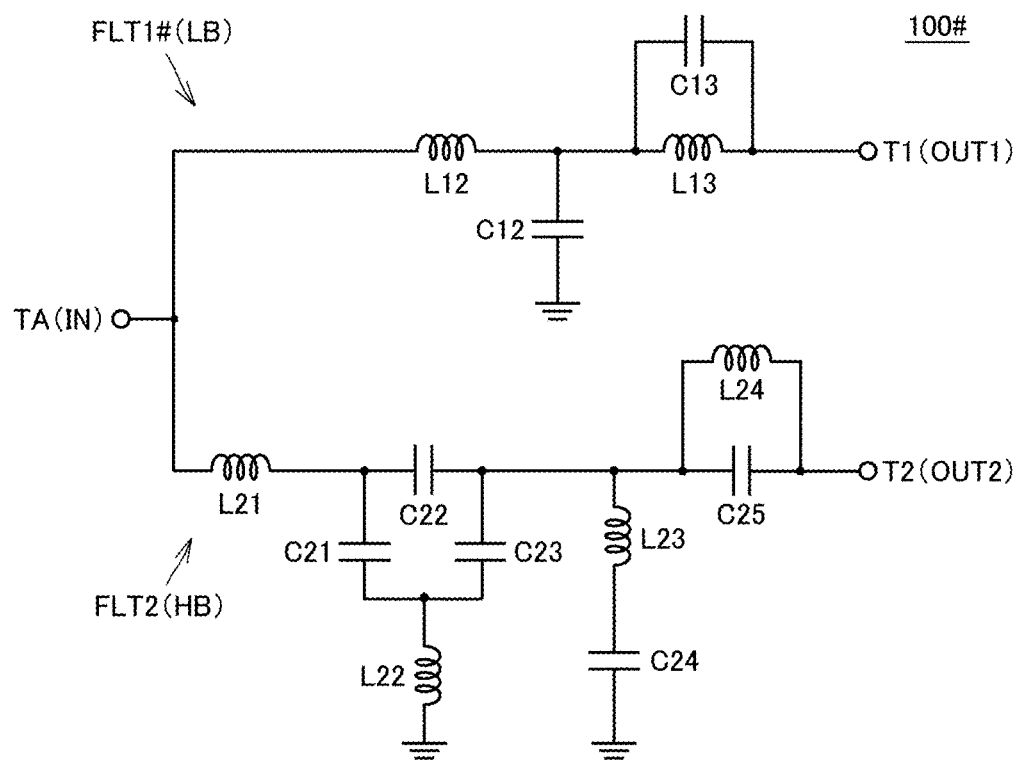
FIG. 6 is a diagram showing an equivalent circuit of a diplexer of a comparative example.

FIG. 6 is a diagram showing an equivalent circuit of a diplexer 100# of the comparative example. A filter FLT1# on a low band side of the diplexer 100# of the comparative example does not include the inductor L11 and the capacitor C11 of the filter FLT1 of the diplexer 100 in FIG. 2. That is, the attenuation pole is not defined by the inductor L11 and the capacitor C11 in the frequency band higher than the pass band of the filter FLT2 on the high band side. In the diplexer 100#, the description of the same or similar elements as those of the diplexer 100 in FIG. 2 will not be repeated.

FIGS. 7A and 7B, and 8A and 8B are diagrams showing simulation results of bandpass characteristics in the diplexer 100# of the comparative example and the diplexer 100 of the present preferred embodiment. Note that, in the simulation, a diplexer having filters in which a pass band LB on a low band side is about 0 GHz to about 1 GHz and a pass band HB on a high band side is about 1.2 GHz to about 3 GHz was simulated.

Figure 7A:
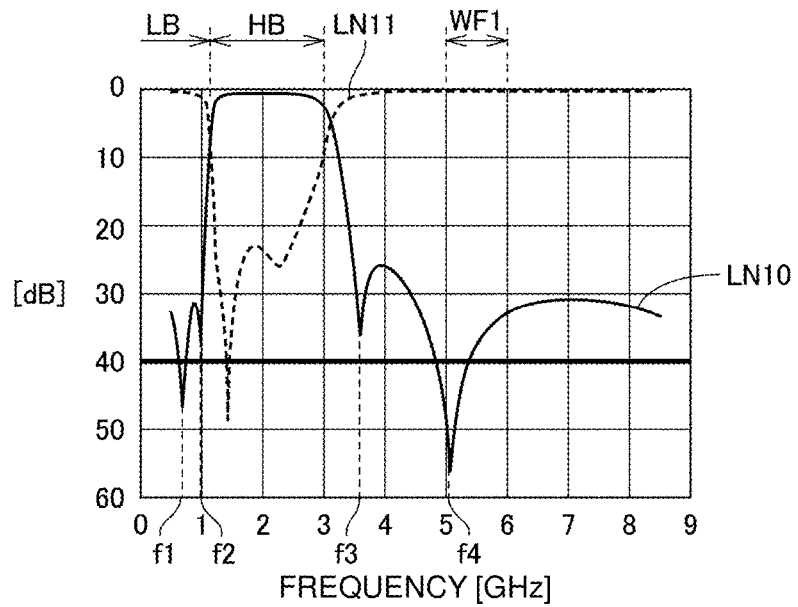
FIGS. 7A and 7B are diagrams showing bandpass characteristics of filters on a high band side.
Figure 7B:
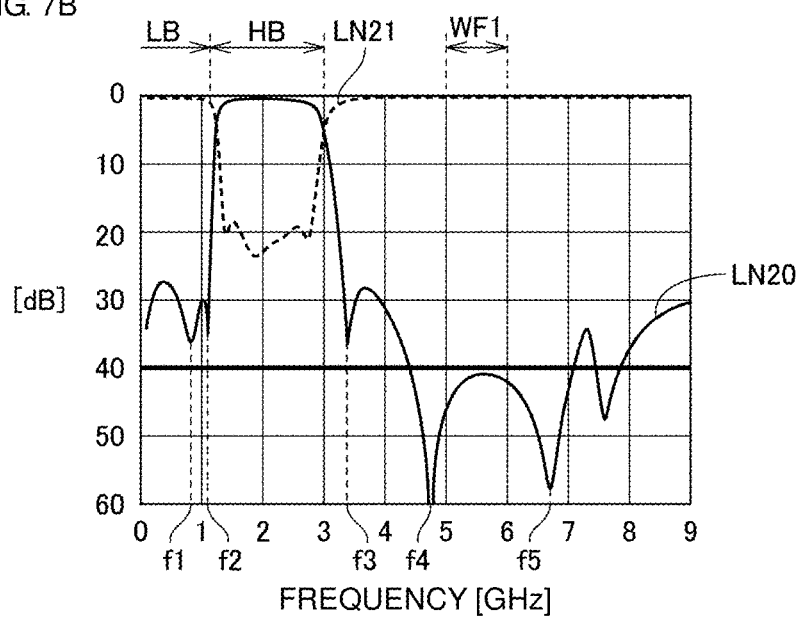

FIGS. 7A and 7B are diagrams showing a comparison of the bandpass characteristics of the filters FLT2 on the high band side of the diplexer 100# shown in FIG. 6 and the diplexer 100. FIG. 7A shows the bandpass characteristics of the diplexer 100# of the comparative example, and FIG. 7B shows the bandpass characteristics of the diplexer 100. Further, in each of FIGS. 7A and 7B, the solid line (LN10 and LN20) indicates the insertion loss of the filter FLT2, and the broken line (LN11 and LN21) indicates the return loss of the filter FLT2.

In each of FIGS. 7A and 7B, an attenuation pole at a frequency f1 is an attenuation pole defined by the inductor L23 of the filter FLT2. An attenuation pole at a frequency f2 is an attenuation pole defined by the inductor L22 of the filter FLT2. An attenuation pole at a frequency f3 is an attenuation pole defined by the inductor L24 of the filter FLT2. An attenuation pole at a frequency f4 is an attenuation pole defined by the inductor L21 of the filter FLT2. An attenuation pole at a frequency f5 is an attenuation pole defined by the inductor L11 of the filter FLT1.

Referring to FIGS. 7A and 7B, in both the diplexer 100# of the comparative example and the diplexer 100 of the present preferred embodiment, the insertion loss in the pass band HB on the high band side is about 0 dB, and the return loss in a portion other than the pass band HB is about 0 dB. However, in the diplexer 100# of the comparative example (FIG. 7A), in a Wi-Fi frequency band (WF1) of the 5 GHz band (about 5 GHz to about 6 GHz) closest to the pass band HB, there is an area where the insertion loss is smaller than about 40 dB and sufficient attenuation characteristics are not obtained.

However, in the diplexer 100 of the present preferred embodiment, the attenuation pole defined by the inductor L11 of the filter FLT1 is added at about 6.7 GHz (f5). With this attenuation pole, the insertion loss is greater than about 40 dB in the entire Wi-Fi frequency band WF1 to provide sufficient attenuation characteristics.

Figure 8A:
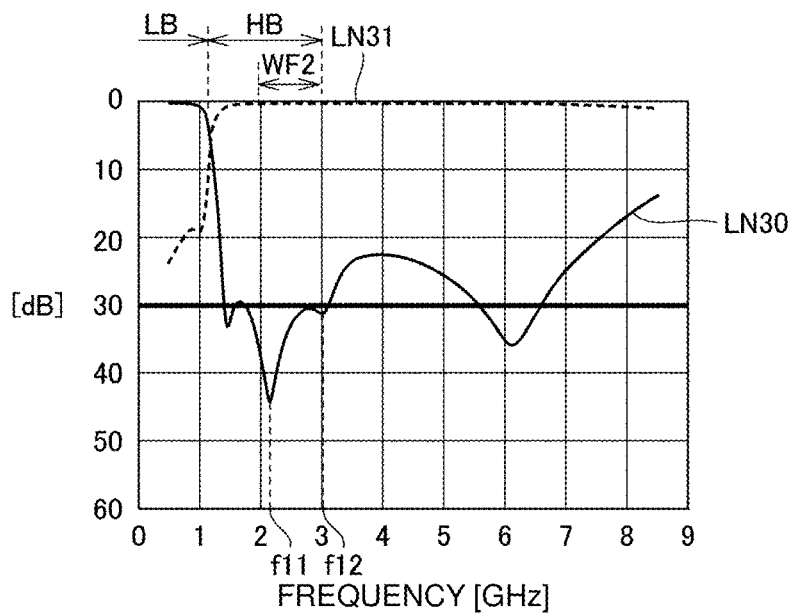
FIGS. 8A and 8B are diagrams showing bandpass characteristics of filters on a low band side.
Figure 8B:
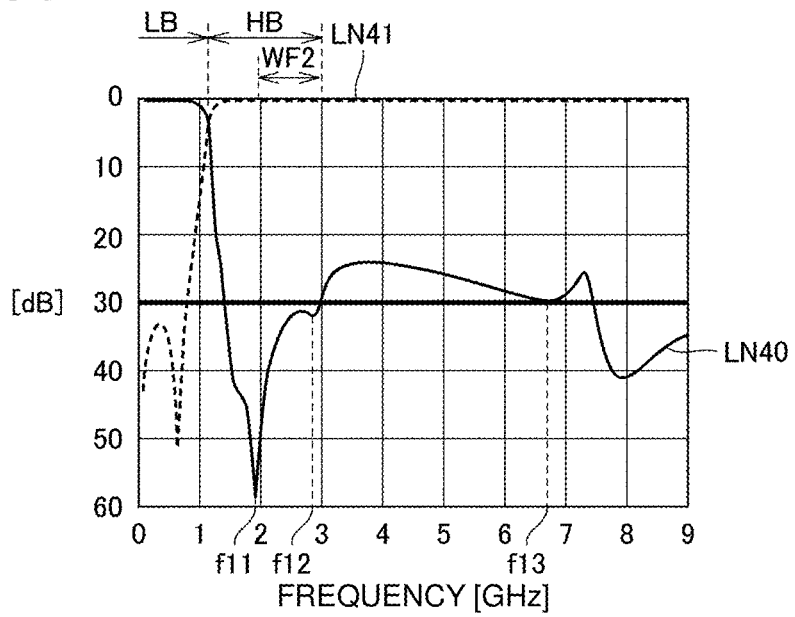

Next, FIGS. 8A and 8B are diagrams showing a comparison of the bandpass characteristics of the filter FLT1# on the low band side of the diplexer 100# and the filter FLT1 on the low band side of the diplexer 100. FIG. 8A shows the bandpass characteristics of the diplexer 100# of the comparative example, and FIG. 8B shows the bandpass characteristics of the diplexer 100. Further, in each of FIGS. 8A and 8B, the solid line (LN30 and LN40) indicates the insertion loss of each of the filter FLT1# and the filter FLT1, and the broken line (LN31 and LN41) indicates the return loss of each of the filter FLT1# and the filter FLT1.

In each of FIGS. 8A and 8B, an attenuation pole at a frequency f11 is an attenuation pole defined by the inductor L12 of each of the filters FLT1# and FLT1. An attenuation pole at a frequency f12 is an attenuation pole defined by the inductor L13 of each of the filters FLT1# and FLT1. An attenuation pole at a frequency f13 is an attenuation pole defined by the inductor L11 of the filter FLT1.

Referring to FIGS. 8A and 8B, in both the diplexer 100# of the comparative example and the diplexer 100 of the preferred embodiment, the insertion loss in the pass band LB on the low band side is about 0 dB, and the return loss in a frequency band higher than the pass band LB is about 0 dB.

In the Wi-Fi frequency band (WF2) of the 2.4 GHz band (about 2 GHz to about 3 GHz) closest to the pass band LB on the low band side, in both the diplexer 100# of the comparative example and the diplexer 100 of the present preferred embodiment, the insertion loss is about 30 dB to about 40 dB. That is, it is understood that the addition of the inductor L11 and the capacitor C11 has a small effect on the bandpass characteristics on the low band side.

As described above, the low inductance inductor is located at a position closest to the common terminal in the filter on the low band side of the diplexer, and a frequency of the attenuation pole defined by the inductor and the capacitor is set higher than the frequency of the pass band of the filter on the high band side. Accordingly, the attenuation characteristics on the high frequency side of the filter on the high band side are able to be significantly improved without significantly increasing the loss of the filter on the low band side.

FIG. 2 is provided as an example, and the features are also applicable to a diplexer including a filter that does not include the specific components and elements shown in FIG. 2. Further, the pass band of each filter may be a frequency band other than the frequency bands described above, and the frequency of the attenuation pole defined by an additional element to the low band side is appropriately set according to the frequency band to be attenuated.

In the diplexer according to the present preferred embodiment, an example in which the inductor added to the filter on the low band side is the meandering coil is described. In a modification of a preferred embodiment of the present invention, a case will be described where an inductor to be added is a linear coil including only a wiring pattern and no via.

Figure 9:
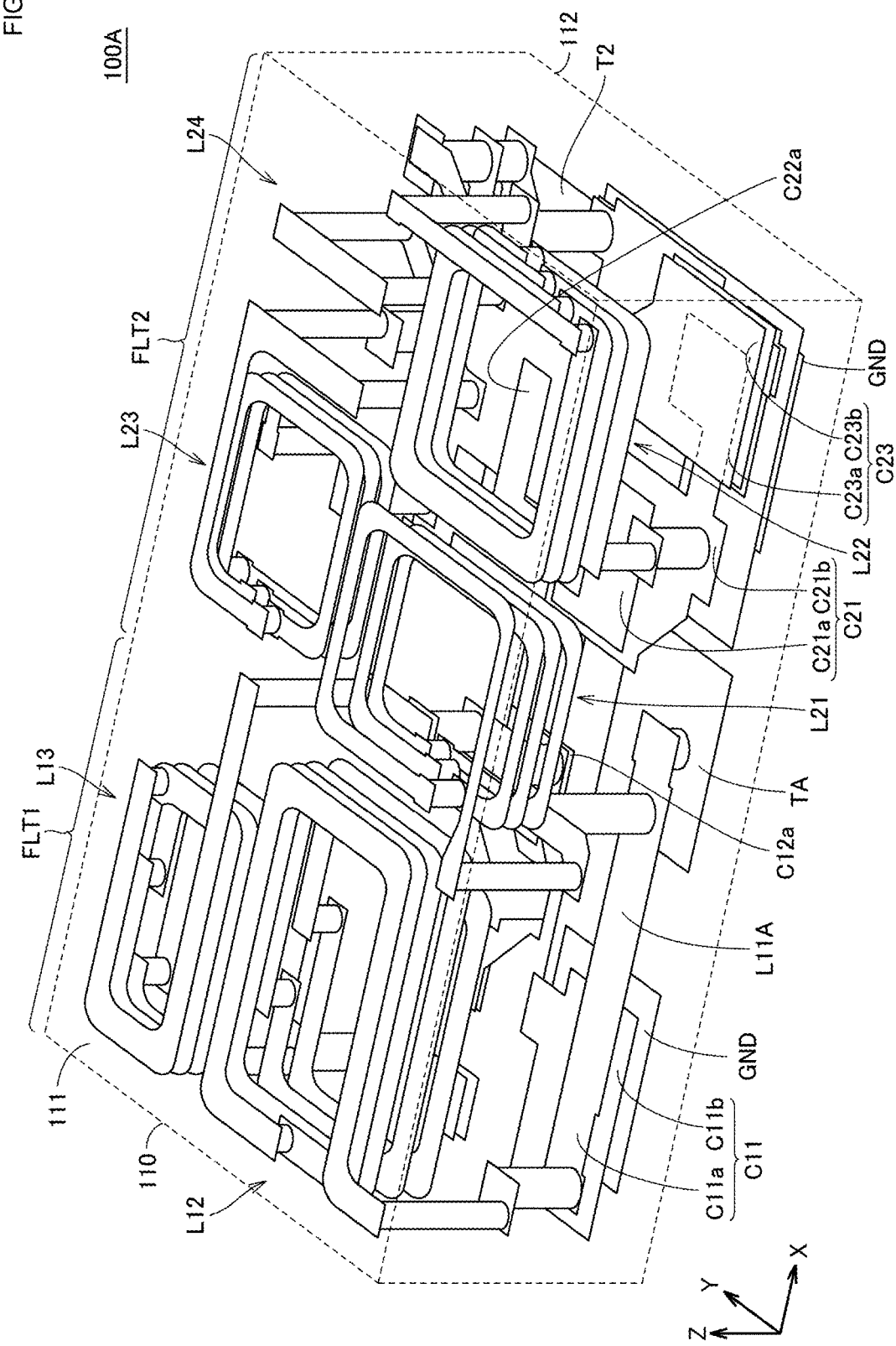
FIG. 9 is a perspective view of internal components and elements of a diplexer according to a modification.

FIG. 9 is a perspective view of internal components and elements of a diplexer 100A according to the modification. In the diplexer 100A shown in FIG. 9, the inductor L11 of the diplexer 100 in FIG. 3 is replaced with an inductor L11A. In FIG. 9, the description of portions overlapping with FIG. 3 will not be repeated.

Referring to FIG. 9, the inductor L11A of the diplexer 100A is a linear wiring pattern provided in a single layer of the dielectric substrate 110. The inductor L11A is electrically connected to the electrode C11a that defines the capacitor C11. By providing the linear inductor L11A, the stray capacitance of the inductor L11A is able to be further significantly reduced. Therefore, the insertion loss in the filter FLT1 on the low band side is able to be further significantly reduced.

Note that the inductor L11A does not necessarily have to have a linear shape as long as it is a wiring pattern provided in a single layer of the dielectric substrate 110, and may be a meandering coil provided in the single layer.

According to the filter device (diplexer) of the present preferred embodiment, the frequency of the attenuation pole defined by the inductor (first inductor) and the capacitor (first capacitor) provided on the common terminal side in the low frequency filter (first filter) is set to be higher than the frequency of the pass band of the high frequency side filter (second filter). This attenuation pole is able to increase the attenuation at the frequency band higher than the pass band of the high frequency side filter. Further, since no element is added to the high frequency side filter, an increase in loss of the high frequency side filter is able to be significantly reduced or prevented.

It should be considered that the preferred embodiments described herein are illustrative in all respects and are not restrictive. The scope of the present invention is provided by the appended claims rather than by the description of the above-described preferred embodiments, and is intended to include meanings equivalent to the claims and all modifications within the scope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device provided in a dielectric substrate with a multilayer structure, the filter device comprising:
   a common terminal;
   a first terminal;
   a second terminal;
   a first filter, provided between the common terminal and the first terminal, that passes a high frequency signal in a first frequency band; and
   a second filter, provided between the common terminal and the second terminal, that passes a high frequency signal in a second frequency band higher than the first frequency band; wherein
   each of the first filter and the second filter includes at least one inductor and at least one capacitor which are provided in the dielectric substrate;
   the first filter includes a first inductor with one end electrically connected to the common terminal, and a first capacitor electrically connected between another end of the first inductor and a ground potential;
   an inductance of the first inductor is smaller than an inductance of another inductor included in the first filter; and
   a frequency of an attenuation pole defined by the first inductor and the first capacitor is higher than a frequency of the second frequency band.

2. The filter device according to claim 1, wherein a capacitance value of the first capacitor is smaller than a capacitance value of another capacitor included in the first filter.

3. The filter device according to claim 1, wherein
   the first filter further includes a second inductor electrically connected to the another end of the first inductor; and
   an inductance of the second inductor is larger than inductances of other inductors included in the first filter.

4. The filter device according to claim 1, wherein the frequency of the attenuation pole defined by the first inductor and the first capacitor is higher than a frequency of an attenuation pole defined by the second filter.

5. The filter device according to claim 1, wherein, when the dielectric substrate is viewed in plan in a laminating direction of the dielectric substrate, the first inductor is located at a position where the first inductor does not overlap with other inductors included in the filter device.

6. The filter device according to claim 1, wherein the first inductor is defined by at least one wiring pattern provided in the dielectric substrate and at least one via electrically connected to the wiring pattern.

7. The filter device according to claim 1, wherein the first inductor is defined by a wiring pattern provided in a single layer of the dielectric substrate.

8. The filter device according to claim 7, wherein the first inductor does not include any vias.

9. A high frequency front end circuit, comprising:
   the filter device according to claim 1; and
   at least one amplifier circuit.

10. The high frequency front end circuit according to claim 9, wherein the common terminal is electrically connected to an antenna.

11. A communication device, comprising:
    the high frequency front end circuit according to claim 9; and
    a radio frequency processing circuit.

12. The filter device according to claim 3, wherein the first inductor and the second inductor of the first filter are electrically connected in series.

13. The filter device according to claim 1, wherein
    each of the first filter and the second filter is defined by wiring patterns and vias provided in layers of the dielectric substrate; and each of the common terminal, the first terminal, and the second terminal is an external terminal provided on at least one exterior surface of the dielectric substrate.

14. The filter device according to claim 1, wherein the first inductor of the first filter is defined by a meandering coil with at least one inverted shape with respect to a direction of current flowing through the first inductor.

15. The filter device according to claim 1, wherein a first inductor of the second filter is defined by a helical coil.

16. The filter device according to claim 1, wherein, when viewed in a plan view, a wiring pattern of the first inductor of the first filter does not overlap with itself.

* * * * *